(12) United States Patent
Yagi

(10) Patent No.: US 11,843,375 B2
(45) Date of Patent: Dec. 12, 2023

(54) SEMICONDUCTOR INTEGRATED CIRCUIT

(71) Applicant: Kioxia Corporation, Minato-ku (JP)

(72) Inventor: Toshihiro Yagi, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 17/968,861

(22) Filed: Oct. 19, 2022

(65) Prior Publication Data

US 2023/0044191 A1 Feb. 9, 2023

Related U.S. Application Data

(63) Continuation of application No. 17/335,599, filed on Jun. 1, 2021, now Pat. No. 11,515,877.

(30) Foreign Application Priority Data

Dec. 3, 2020 (JP) .................................. 2020-201175

(51) Int. Cl.
- *H03L 5/00* (2006.01)
- *H03K 3/037* (2006.01)
- *H03K 3/356* (2006.01)
- *H03K 19/003* (2006.01)
- *H03K 19/0185* (2006.01)

(52) U.S. Cl.
CPC ............................ *H03K 19/018521* (2013.01)

(58) Field of Classification Search
None
See application file for complete search history.

(56) References Cited

U.S. PATENT DOCUMENTS

| | | | |
|---|---|---|---|
| 6,130,556 | A | 10/2000 | Schmitt |
| 6,774,695 | B2 | 8/2004 | Hayashi |
| 7,112,996 | B2 | 9/2006 | Lee |
| 7,215,146 | B2 | 5/2007 | Khan |
| 7,777,548 | B2 | 8/2010 | Kang |
| 7,808,294 | B1 | 10/2010 | Kottapalli |
| 9,059,715 | B2 | 6/2015 | Hsu et al. |
| 9,748,957 | B2 | 8/2017 | Kumar |
| 10,560,084 | B2 | 2/2020 | Yagi |
| 10,804,884 | B1 | 10/2020 | Tsai et al. |
| 2005/0146355 | A1 | 7/2005 | Kase et al. |
| 2012/0081166 | A1 | 4/2012 | Draxelmayr |
| 2015/0263731 | A1 | 9/2015 | Kushiyama |
| 2015/0381178 | A1* | 12/2015 | Nguyen ............... H03K 5/1565 326/68 |

FOREIGN PATENT DOCUMENTS

JP 2019-50550 3/2019

* cited by examiner

*Primary Examiner* — Kenneth B Wells
(74) *Attorney, Agent, or Firm* — Oblon, McClelland, Maier & Neustadt, L.L.P.

(57) ABSTRACT

A semiconductor integrated circuit of embodiments includes a first MOS transistor configured to control conduction and non-conduction between a reference voltage point and a node, a second MOS transistor connected to the first MOS transistor via the node and configured to apply a voltage equal to or lower than a withstand voltage of the first MOS transistor to the node, a third MOS transistor configured to receive supply of a second voltage higher than the first voltage, and output an output signal of a signal level corresponding to a voltage range of the second voltage, and a switch circuit configured to make a voltage of the node a fixed voltage when the first MOS transistor is in an OFF state.

4 Claims, 8 Drawing Sheets

SEMICONDUCTOR INTEGRATED CIRCUIT

CROSS-REFERENCE TO RELATED APPLICATION

This application is a continuation of and claims the benefit of priority under 35 U.S.C. § 120 from U.S. application Ser. No. 17/335,599 filed Jun. 1, 2021 (now U.S. Pat. No. 11,515,877 issued Nov. 29, 2022), and claims the benefit of priority under 35 U. S.C. § 119 from Japanese Patent Application No. 2020-201175 filed Dec. 3, 2020, the entire contents of each of which are incorporated herein by reference.

FIELD

Embodiments described herein relate generally to a semiconductor integrated circuit.

BACKGROUND

In the related art, a level-shift circuit has been sometimes employed to transmit signals to electric circuits using different power supply voltages. This type of level-shift circuit includes a circuit which has a tolerant function which takes into account withstand voltages of elements to be mounted. The tolerant function is a function which prevents a voltage exceeding the withstand voltages from being applied to the respective elements in the circuit, and, for example, a circuit having a tolerant structure using MOS transistors having a stack configuration is sometimes employed to implement the function.

However, use of the MOS transistors having a stack configuration causes a delay in state transition of an output node. Further, a case can occur where a duty ratio of output does not reach 50%.

Thus, a level-shift circuit employing a tolerant structure has a problem that it is difficult to perform high-speed transmission.

DETAILED DESCRIPTION

A semiconductor integrated circuit of an embodiment includes a first transistor configured to receive an input signal of a first signal level corresponding to a voltage range of a first voltage at a gate and control conduction and non-conduction between a reference voltage point and a node, a second MOS transistor connected to the first MOS transistor via the node to configure a stack with the first MOS transistor and configured to receive supply of a bias voltage at a gate and apply a voltage equal to or lower than a withstand voltage of the first MOS transistor to the node, a third MOS transistor configured to receive supply of a second voltage higher than the first voltage, receive a signal of a level in accordance with operation of the first MOS transistor at a gate and output an output signal of a second signal level corresponding to a voltage range of the second voltage, and a switch circuit configured to make a voltage of the node a fixed voltage when the first MOS transistor is in an OFF state.

Embodiments of the present invention will be described in detail below with reference to the drawings.

First Embodiment

Figure 1:
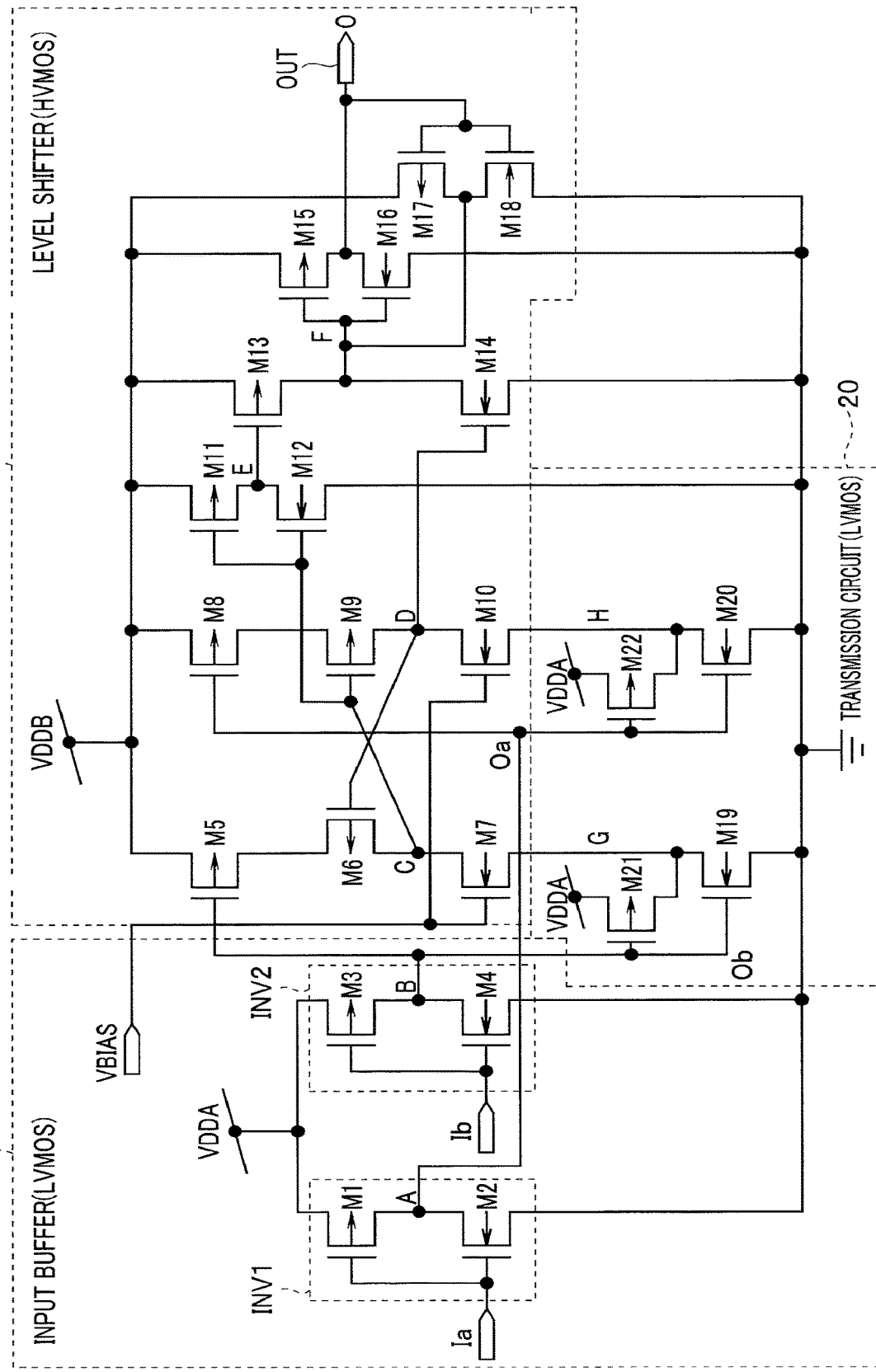
FIG. 1 is a circuit diagram illustrating a semiconductor integrated circuit according to a first embodiment of the present invention.

FIG. 1 is a circuit diagram illustrating a semiconductor integrated circuit according to a first embodiment of the present invention. Further, FIG. 2 is a block diagram illustrating a memory system including the semiconductor integrated circuit in FIG. 1.

The semiconductor integrated circuit in the present embodiment configures a level-shift circuit which has a tolerant function using MOS transistors having a stack configuration and can improve a duty ratio by stabilizing a delay period of an output node by fixing a voltage of an intermediate node which will be described later and which is connected to terminals of the MOS transistors having the stack configuration using a switch circuit. Further, the semiconductor integrated circuit in the present embodiment configures a level-shift circuit which can further improve a duty ratio by synthesizing differential output. Improvement of the duty ratio enables the semiconductor integrated circuit in the present embodiment to achieve high-speed signal transmission.

Figure 2:
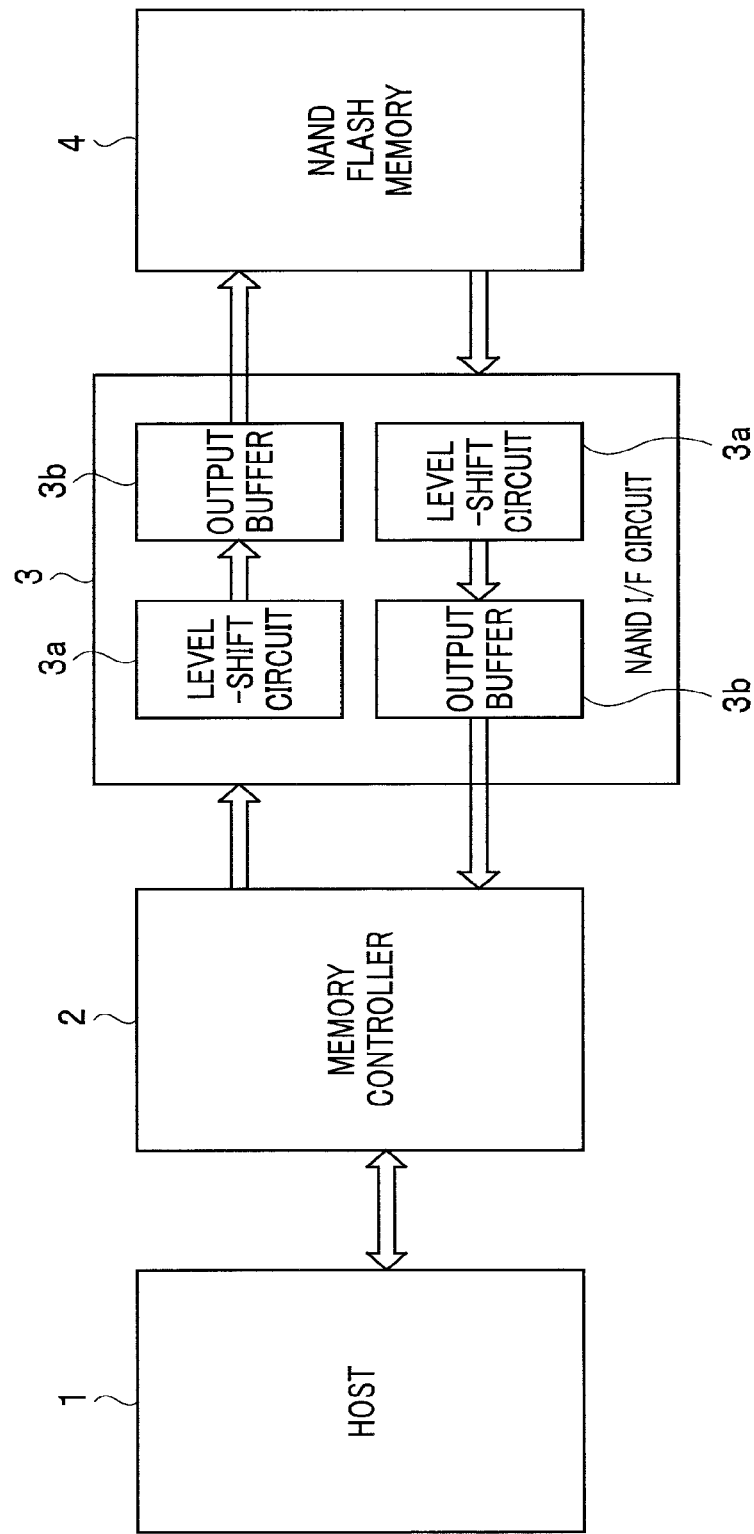
FIG. 2 is a block diagram illustrating a memory system including the semiconductor integrated circuit in FIG. 1.

In the memory system in FIG. 2, a host 1 is connected to a memory controller 2 via a HOST interface. For example, as the interface, various kinds of interfaces such as a parallel interface of eMMC (embedded multi-media card), a serial extension interface of PCIe (peripheral component interconnect-express) and a high-speed serial interface of M-PHY are employed. Note that the host 1 and the memory controller 2 incorporate interface circuits which employ the various kinds of interfaces.

The memory controller 2 is connected to a NAND flash memory 4 via a NAND interface (I/F) circuit 3. The NAND I/F circuit 3 employs, for example, various kinds of interfaces such as high-speed data transfer mode such as toggle double data rate (Toggle DDR) and an open NAND flash interface (ONFI), and transfers data between the memory controller 2 and the NAND flash memory 4.

The host 1 issues a write request or a read request to the memory controller 2. The memory controller 2 controls write of data in the NAND flash memory 4 and readout of data from the NAND flash memory 4 in accordance with the request from the host.

The memory controller 2 and the NAND flash memory 4, for example, transmit various kinds of signals such as a signal for transmitting and receiving respective signals including data DQ<7:0>, a data strobe signal DQS, /DQS, a chip enable signal CE, a command latch enable signal CLE, an address latch enable signal ALE, a write enable signal/ WE, a read enable signal RE, /RE and a write protect signal WP via the NAND I/F circuit 3.

The NAND I/F circuit 3 includes a level-shift circuit 3a and an output buffer 3b. The level-shift circuit 3a shifts a voltage level of data which is supplied from the memory controller 2 and which is processed inside the NAND I/F circuit 3 to a high voltage and then outputs the data to the memory controller 2 via the output buffer 3b. Further, the level-shift circuit 3a shifts a voltage level of data which is supplied from the NAND flash memory 4 and which is processed inside the NAND I/F circuit 3 to a high voltage and then outputs the data to the memory controller 2 via the output buffer 3b.

Note that level-shift circuits having the same configuration as a configuration of the level-shift circuit 3a in the present embodiment may be incorporated into the host 1, the memory controller 2 and the NAND flash memory 4 as well as the NAND I/F circuit 3. Further, the NAND I/F circuit 3 may be omitted, and an interface circuit having functions similar to functions of the NAND I/F circuit 3 may be incorporated into the memory controller 2 and the NAND flash memory 4.

While an example will be described where the present embodiment is applied to an interface circuit (NAND interface circuit) between the NAND flash memory which is a non-volatile semiconductor storage device and the memory controller, the present embodiment can be applied to various kinds of interface circuits.

(Problem)

Figure 3:
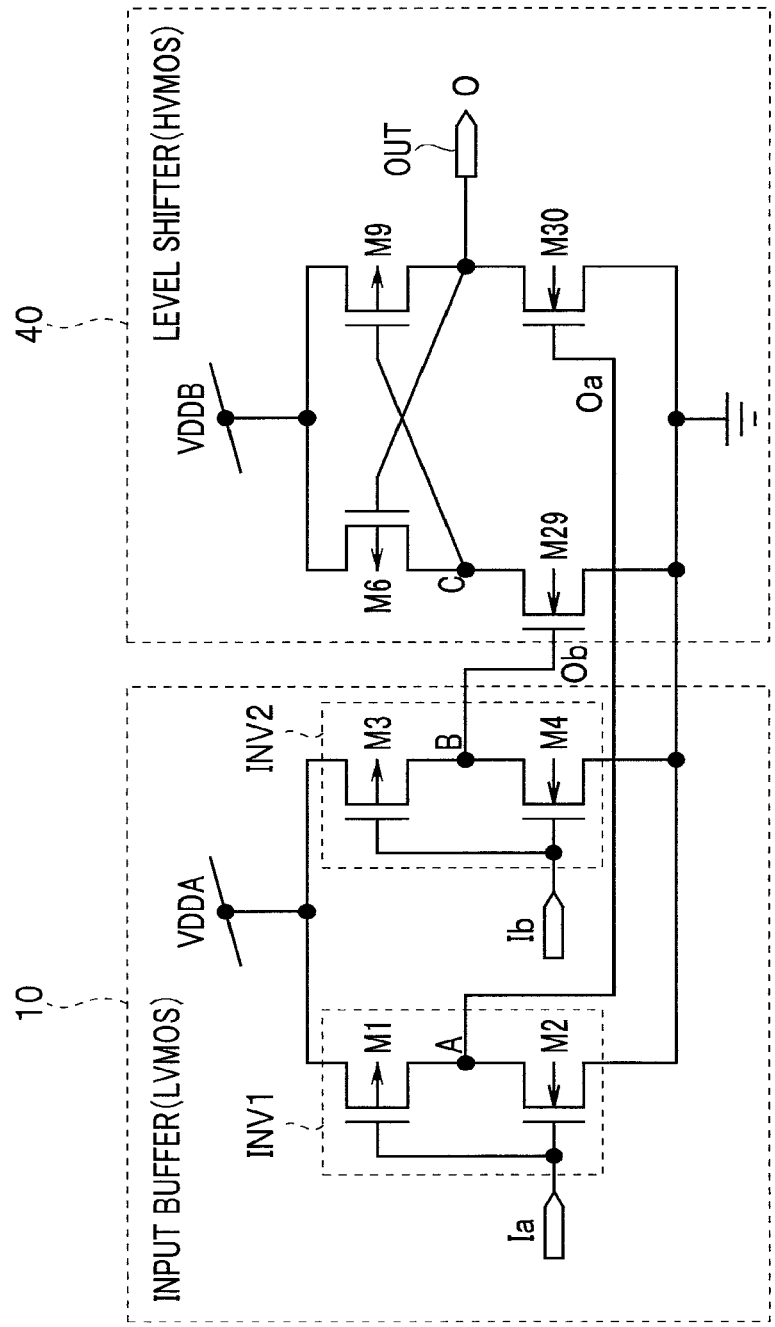
FIG. 3 is a circuit diagram illustrating a comparative example of the semiconductor integrated circuit in the present embodiment.
Figure 4:
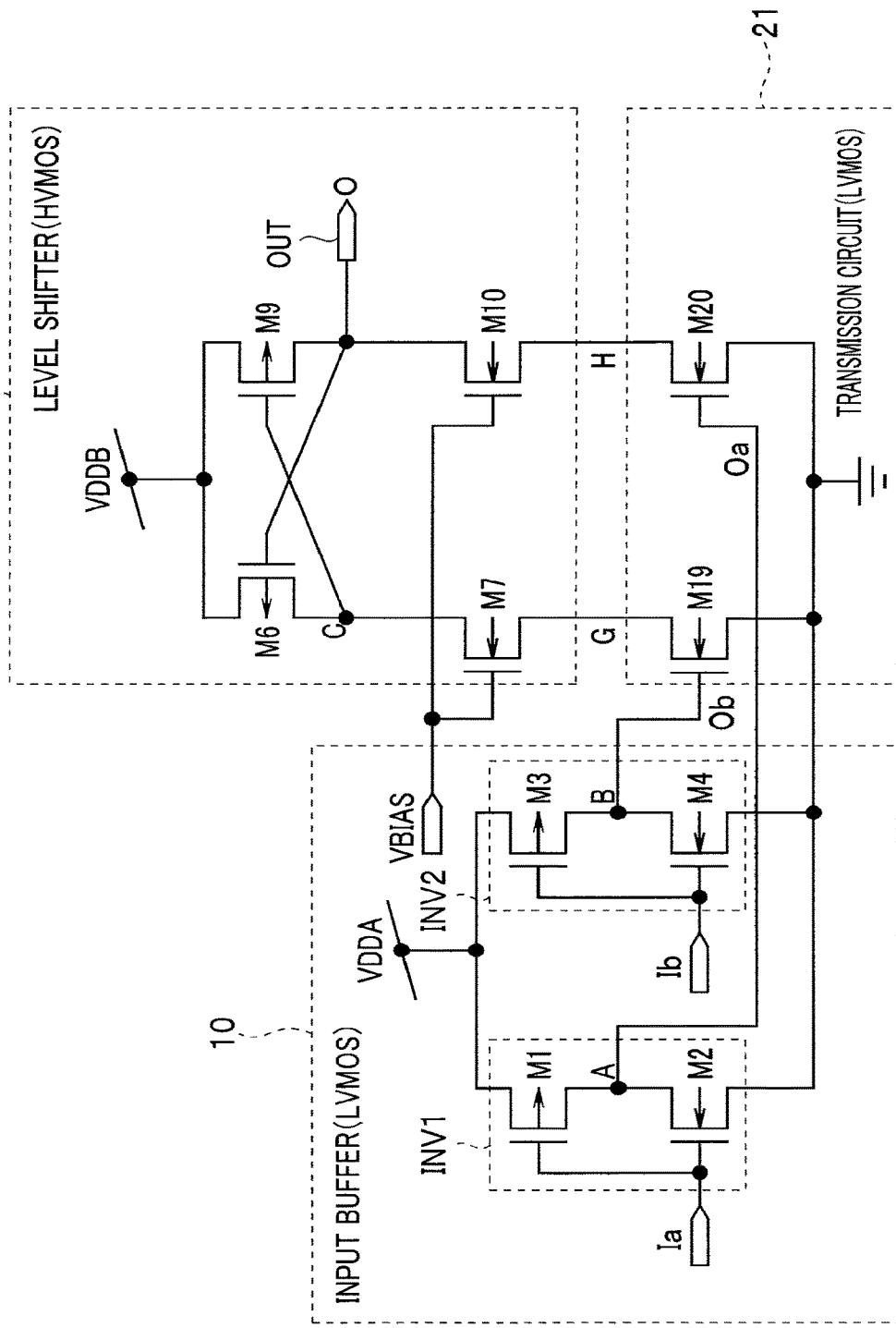
FIG. 4 is a circuit diagram illustrating a comparative example of the semiconductor integrated circuit in the present embodiment.

A problem that it is difficult to achieve higher speed transmission with a level-shift circuit having a tolerant structure will be described next with reference to FIG. 3 to FIG. 6. FIG. 3 and FIG. 4 are circuit diagrams illustrating comparative examples of the semiconductor integrated circuit in the present embodiment. FIG. 3 illustrates a level-shift circuit which does not have a tolerant structure, and FIG. 4 illustrates a level-shift circuit having a tolerant structure. Note that in FIG. 1, FIG. 3 and FIG. 4, the same reference numerals will be assigned to the same components, and repetitive description concerning the same configurations will be omitted.

The level-shift circuit in FIG. 3 is configured with an input buffer 10 and a level shifter 40. The input buffer 10 includes two inverters INV1 and INV2 which generate differential output (signals Oa and Ob) from differential input signals Ia and Ib which are input. The inverter INV1 is configured with a PMOS transistor M1 and an NMOS transistor M2, and the inverter INV2 is configured with a PMOS transistor M3 and an NMOS transistor M4. The input signal Ia is supplied to gates of the transistors M1 and M2, and the input signal Ib is supplied to gates of the transistors M3 and M4.

A power supply voltage VDDA is applied to a source of the transistor M1 from a power supply line, and a drain of the transistor M1 is connected to a drain of the transistor M2. A source of the transistor M2 is connected to a reference voltage point. The power supply voltage VDDA is applied to a source of the transistor M3 from the power supply line, and a drain of the transistor M3 is connected to a drain of the transistor M4. A source of the transistor M4 is connected to the reference voltage point.

The input signal Ia is inverted by the inverter INV1, and the signal Oa which is an inverted signal appears at a connection point (hereinafter, referred to as a node A) between the drain of the transistor M1 and the drain of the transistor M2. Further, the input signal Ib which is an inverted signal of the input signal Ta is inverted by the inverter INV2. The signal Ob which is an inverted signal of the signal Oa appears at a connection point (hereinafter, referred to as a node B) between the drain of the transistor M3 and the drain of the transistor M4.

The input buffer 10 operates at a relatively low power supply voltage VDDA, and the transistors M1 to M4 are, for example, configured with circuits (hereinafter, referred to as LVMOS) which are configured with thin-film transistors having a relatively low withstand voltage.

The level shifter 40 receives differential input and outputs single output. The level shifter 40 receives the signals Oa and Ob from the input buffer 10 as differential input and outputs the output signal O from an output terminal OUT (hereinafter, also referred to as a node OUT). The level shifter 40 includes a cross couple circuit configured with PMOS transistors M6 and M9, and NMOS transistors M29 and M30. The transistors M29 and M30 configure a transmission circuit which transmits the signals Oa and Ob to the cross couple circuit.

A power supply voltage VDDB is supplied to a source of the transistor M6 from a power supply line, and a drain of the transistor M6 is connected to a gate of the transistor M9. The power supply voltage VDDB is supplied to a source of the transistor M9 from the power supply line, and a drain of the transistor M9 is connected to a gate of the transistor M6. The drains of the transistors M6 and M9 are respectively connected to drains of transistors M29 and M30. A source of the transistor M29 is connected to the reference voltage point, and the signal Ob is supplied to a gate of the transistor M29. A source of the transistor M30 is connected to the reference voltage point, and the signal Oa is supplied to a gate of the transistor M30.

In a case where the node B is a high level (hereinafter, an H level), and the node A is a low level (hereinafter, an L level), the transistor M29 is put into an ON state and the transistor M30 is put into an OFF state. In this case, a connection point (hereinafter, referred to as a node C) between the drain of the transistor M6 and the drain of the transistor M29 becomes the L level, the transistor M9 is put into an ON state, and a connection point (output terminal OUT) between the drain of the transistor M9 and the drain of the transistor M30 becomes the H level. By the cross couple circuit configured with the transistors M6 and M9, the transistor M6 is put into an OFF state, the node C remains to be the L level, and the output terminal OUT remains to be the H level.

Inversely, in a case where the node A is the H level, and the node B is the L level, the transistor M29 is put into an OFF state, and the transistor M30 is put into an ON state. In this case, the output terminal OUT becomes the L level. By the cross couple circuit configured with the transistors M6 and M9, the node C becomes the H level, the transistor M9 is put into an OFF state, and the output terminal OUT remains to be the L level.

The level shifter 40 operates at a relatively high power supply voltage VDDB. The transistors M6, M9, M29 and M30 are, for example, configured with circuits (hereinafter, referred to as HVMOS) which are configured with thick-film transistors having a relatively high withstand voltage.

When the input signal Ia of the H level is input to the input buffer 10, a signal of the H level is output from the output terminal OUT, and when the input signal Ia of the L level is input to the input buffer 10, a signal of the L level is output from the output terminal OUT. The power supply voltage VDDA is supplied to the input buffer 10, and the power supply voltage VDDB is supplied to the level shifter 40. As a result, levels of the signals Oa and Ob of the nodes A and B which change in a range from 0 to VDDA are shifted to a level of the output signal O which changes from 0 to VDDB, and the output signal O is output.

The transistors M29 and M30 of the level shifter 40 are thick-film transistors and have a relatively high threshold voltage Vth. In contrast, the power supply voltage VDDA is set at a lower voltage due to the influence of lower power consumption of an LSI, or the like, in recent years. In other words, the signals Oa and Ob of the nodes A and B have lower levels. As a result, there is a case where the levels of the signals Oa and Ob do not exceed the threshold voltage Vth of the transistors M29 and M30, in which case, a problem arises that the level-shift circuit does not normally operate.

Thus, there is a case where a circuit in FIG. 4 which employs thin-film transistors as transistors configuring the transmission circuit is employed. In the circuit in FIG. 4, the transistors M29 and M30 in FIG. 3 are replaced with transistors M19 and M20 which are LVMOS having a relatively low threshold voltage. Thus, the transistors M19 and M20 can be reliably put into an ON state or OFF state in accordance with change of the nodes B and A.

However, replacement of the thick-film transistors M29 and M30 with the thin-film transistors M19 and M20 merely results in application of a relatively high voltage VDDB to the transistors M19 and M20, which causes concern that characteristics of the transistors M19 and M20 having a relatively low withstand voltage may fluctuate or collapse. Thus, the level-shift circuit in FIG. 4 has a tolerant structure which employs circuits protecting the transistors M19 and M20. In other words, in the level-shift circuit in FIG. 4, the transmission circuit 21 is configured with LVMOS, and a protection circuit configured with thick-film transistors M7 and M10 are provided at the level shifter 31 configured with HVMOS.

An NMOS transistor M7 is provided between a drain (node C) of the transistor M6 and a drain (hereinafter, referred to as a node G) of the transistor M19. Further, an NMOS transistor M10 is provided between the drain (output terminal OUT) of the transistor M9 and a drain (hereinafter, referred to as a node H) of the transistor M20. The transistors M7 and M10 are thick-film transistors. Note that hereinafter, the node G and the node H will be also referred to as intermediate nodes.

A drain of the transistor M7 is connected to the drain of the transistor M6, a source of the transistor M7 is connected to the drain of the transistor M19, and a predetermined bias voltage VBIAS is applied to a gate of the transistor M7. A drain of the transistor M10 is connected to the drain of the transistor M9, a source of the transistor M10 is connected to the drain of the transistor M20, and the predetermined bias voltage VBIAS is applied to a gate of the transistor M10. The transistor M7 and the transistor M10 are configured with thick-film transistors to protect the transistors M19 and M20.

A drain-source voltage Vds when the transistor M7 is in an ON state becomes a value in accordance with the bias voltage VBIAS. Thus, by setting the bias voltage VBIAS at an appropriate voltage, it is possible to make a voltage at the source (node G) of the transistor M7 equal to or lower than a predetermined voltage. Further, in a similar manner, the drain-source voltage Vds when the transistor M10 is in an ON state becomes a value in accordance with the bias voltage VBIAS. Thus, by setting the bias voltage VBIAS at an appropriate voltage, it is possible to make a voltage at the source (node H) of the transistor M10 equal to or lower than a predetermined voltage. The bias voltage VBIAS is set at an appropriate value so that voltages of the node G and the node H become equal to or lower than a voltage which does not exceed withstand voltages of the transistors M19 and M20.

In this manner, the level-shift circuit in FIG. 4 in which the transmission circuit 21 is configured with the thin-film transistors M19 and M20 enables change of input signals to be reliably transmitted to the level shifter 31 and prevents a voltage equal to or higher than the withstand voltage from being applied between the drains and the sources of the thin-film transistors M19 and M20 by the protection circuit configured with the transistors M7 and M10.

Figure 5:
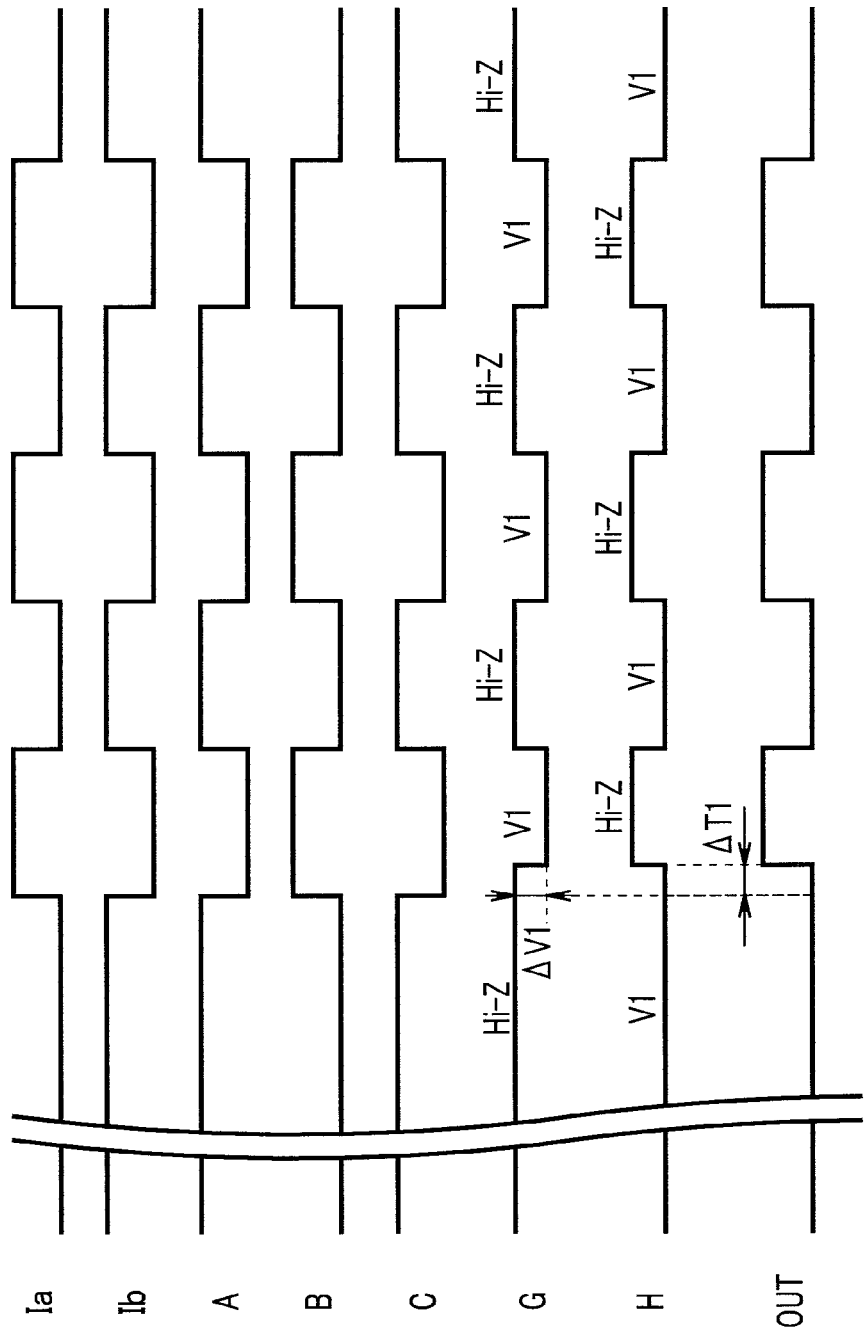
FIG. 5 is a timing chart for explaining a problem.
Figure 6:
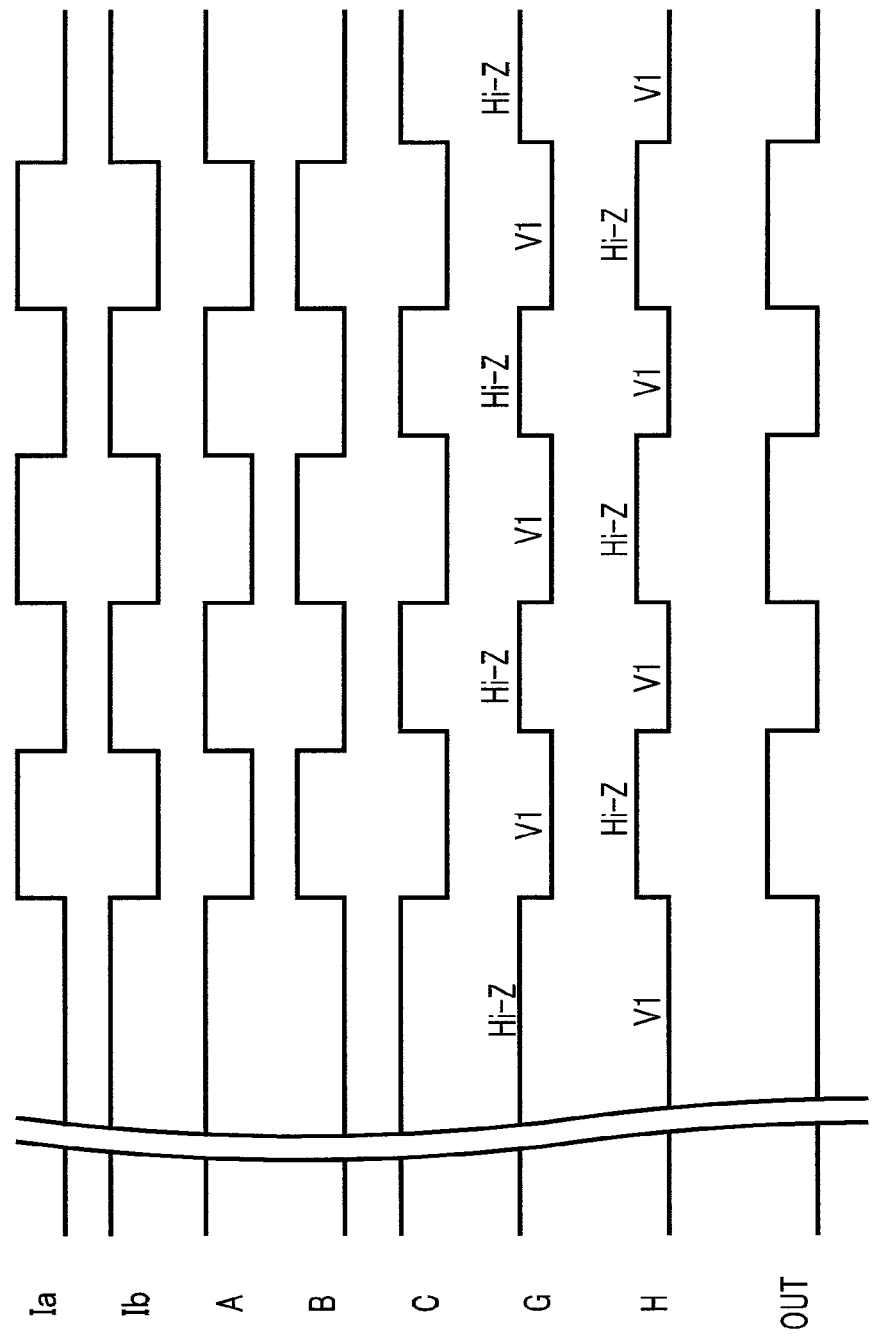
FIG. 6 is a timing chart for explaining a problem.

However, there is a problem that the level-shift circuit in FIG. 4 cannot transmit signals at high speed. FIG. 5 and FIG. 6 are timing charts for explaining the problem. FIG. 5 and FIG. 6 illustrate the input signals Ia, Ib and signals appearing at the nodes A, B, C, G, H and OUT.

It is assumed that after the power supply voltages VDDA and VDDB are applied, the input signal 1a is the L level (the input signal Ib is the H level), the signal Oa is the H level, and the signal Ob is the L level. In this state, the transistor M20 is in an ON state, and the transistor M19 is in an OFF state.

The transistor M20 is in an ON state, and thus, a voltage of the node H becomes a value on the L level side. Note that FIG. 5 and FIG. 6 indicate that the voltage of the node H becomes a voltage V1 on the L level side by the influence of the bias voltage VBIAS. On the other hand, the transistor M19 is in an OFF state, and thus, the node G becomes Hi-Z (high impedance). Note that Hi-Z means that a voltage of the node is inconstant and can take various positive and negative values. FIG. 5 and FIG. 6 indicate an example where voltages of the nodes G and H become equal to or lower than VDDB/2 when the nodes G and H are Hi-Z.

In a case where the transistor M20 is in an ON state, a voltage of the node H is a voltage V1 on the L level side, and thus, the output terminal OUT is the L level. Thus, the transistor M6 is in an ON state, and the node C is the H level. The transistor M9 remains to be in an OFF state, and the output terminal OUT remains to be the L level.

Then, it is assumed that a state transitions from a state where the input signal Ia is the L level to a state where the input signal Ia is the H level (the input signal Ib is the L level). The input signals 1a and Ib are respectively inverted by the inverters INV1 and INV2. The signals Oa and Ob which are inverted signals of the input signals Ia and Ib respectively appear at the nodes A and B. In other words, a state of the node A transitions from the H level to the L level, and a state of the node B transitions from the L level to the H level. As a result, a state of the transistor M19 is switched from an OFF state to an ON state, and a state of the transistor M20 is switched from an ON state to an OFF state.

The transistor M7 which configures a stack with the transistor M19 is provided between the node C and the transistor M19. Further, the transistor M10 which configures a stack with the transistor M20 is provided between the output terminal OUT and the transistor M20. Thus, the levels of the node C and the output terminal OUT transition after a predetermined delay period since the states of the transistor M19 and the transistor M20 has been switched between an ON state and an OFF state. The level of the node C transitions to the L level as a result of the transistor M19 being put into an ON state. By this means, the transistor M9 is put into an ON state, and the level of the output terminal OUT transitions to the H level. As a result, the transistor M6 is put into an OFF state, and the node C remains to be the L level.

Then, it is assumed that the state transitions from a state where the input signal Ia is the H level to a state where the input signal Ia is the L level (the input signal Ib is the H level). The input signals Ia and Ib are respectively inverted by the inverters INV1 and INV2. A level of the node A transitions from the L level to the H level, and a level of the node B transitions from the H level to the L level. As a result, the state of the transistor M19 is switched from an ON state to an OFF state, and the state of the transistor M20 is switched from an OFF state to an ON state.

After a predetermined delay period since the states of the transistors M19 and M20 has been switched between an ON state and an OFF state, levels of the nodes C and OUT transition. In other words, the level of the output terminal OUT transitions to the L level as a result of the transistor M20 being put into an ON state. By this means, the transistor M6 is put into an ON state, and the level of the node C transitions to the H level. As a result, the transistor M9 is put into an OFF state, and the output terminal OUT remains to be the L level.

Thereafter, as a result of the levels of the input signals Ia and Ib transitioning between the H level and the L level in a similar manner, the level of the output terminal OUT also transitions. In this case, a relatively large delay period occurs in transition of the nodes C and OUT due to, particularly, a configuration where the transistors M7 and M10 are respectively stacked on the transistors M19 and M20. If the delay period equally occurs at the nodes C and OUT and equally occurs in transition from the H level to the L level (hereinafter, referred to as falling transition) and transition from the L level to the H level (hereinafter, referred to as rising transition), no particular problem occurs. However, there is a problem that higher speed transmission is inhibited as a result of the nodes G and H becoming Hi-Z and a delay period unequally occurring in falling transition and rising transition.

FIG. 5 illustrates a delay due to Hi-Z which inhibits higher speed transmission among delays of signals by respective elements and omits illustration of other kinds of delays to clarify a problem of the level-shift circuit in FIG. 4.

In the example in FIG. 5, upon initial rising transition of the input signal Ia after power-on, a voltage of the node G transitions from Hi-Z to the voltage V1 after a delay period ΔT1 since rising transition of the node B. Further, in this event, a voltage of the node H transitions from the voltage V1 to Hi-Z after the delay period ΔT1 since falling transition of the node A. As described above, the levels of the nodes C and OUT transition by transition of the levels of the nodes G and H, the level of the node C becomes the L level, and the level of the output terminal OUT becomes the H level.

The delay period ΔT1 is a period corresponding to a voltage difference ΔV1 between the level of Hi-Z and the voltage V1. The level of Hi-Z is inconstant, and thus, the delay period ΔT1 fluctuates every time the input signals Ia and Ib change. As a result, a pulse width and a duty ratio fluctuate, and intersymbol interference (ISI) becomes larger.

Note that for example, in a case where a clock cycle, a voltage, a temperature, or the like, is constant in a case where the input signals Ia and Ib are clock signals, Hi-Z sometimes converges to a predetermined value. FIG. 5 illustrates such a case, and Hi-Z converges to a predetermined value. After Hi-Z converges, no particular problem occurs, but the duty ratio largely varies in a state where Hi-Z is inconstant at initial activation, or the like.

For example, at the I/F, there is a case where a DDR (double data rate) scheme is employed. In the DDR scheme, data is sampled by utilizing rising and falling of a clock. Thus, in a case where the delay period ΔT1 is not constant and an edge timing of the clock fluctuates or the duty ratio is not 50%, a width of a valid sampling timing for reliably acquiring data becomes narrow. As a result, it is necessary to make a setup time and a hold time longer and it is difficult to shorten a clock cycle, so that it is impossible to achieve higher speed transmission.

FIG. 6 illustrates a delay between rising transition and falling transition which inhibit higher speed transmission among delays of signals by respective elements and omits illustration of other delays to clarify the problem of the level-shift circuit in FIG. 4.

The level-shift circuit generates the output signal O corresponding to the input signals Ia and Ib by the states of the transistors M19 and M20 which configure the transmission circuit being switched between an ON state and an OFF state. Thus, the transistors M19 and M20 are configured with thin-film transistors and configured to have performance of relatively precipitously transitioning to an ON state. Thus, speed of falling transition of the nodes C and OUT is relatively high, and, inversely, speed of rising transition is relatively slower than the speed of falling transition.

As a result, as illustrated in FIG. 6, even if the input signals Ia and Ib are signals having a duty ratio of 50%, signals appearing at the nodes C and OUT have a longer L level period than an H level period. In other words, the duty ratio of the output signal O does not become 50%.

In this manner, as a result of the transistors M19 and M20 which configure the transmission circuit being made to have thin films to improve performance of transitioning to an ON state, and the transistors M7 and M10 which configure the protection circuit being respectively stacked on the transistors M19 and M20 for achieving a tolerant structure, a problem arises that a cycle of the output signal is not constant, the duty ratio does not become 50%, and it is difficult to transmit signals at high speed.

(Configuration)

Thus, in the present embodiment, a circuit which makes voltages of the intermediate nodes (nodes G and H) at a constant value is added. By this means, it is possible to obtain the output signal O having a duty ratio of substantially 50% in a stable cycle. Further, the output signal O is generated by utilizing signals appearing at the node C and the node D (the node OUT in the comparative example in FIG. 4). By this means, it is possible to reliably obtain the output signal O having a duty ratio of 50%.

The level-shift circuit in FIG. 1 is configured such that the transistors M5, M8, M11 to M18, M21 and M22 are added to the level-shift circuit in FIG. 4. A transmission circuit 20 is configured with LVMOS. The transmission circuit 20 is different from the transmission circuit 21 in FIG. 4 in that the transistors M21 and M22 which function as switch circuits are added.

A drain of the PMOS transistor M21 which is a thin-film transistor is connected to the intermediate node (node G) which is a connection point between the drain of the transistor M19 and the drain of the transistor M7. The signal Ob is supplied to a gate of the transistor M21 from the node B, and the power supply voltage VDDA is supplied to a source of the transistor M21 from the power supply line. By this means, the transistor M21 is put into an OFF state when the transistor M19 is in an ON state and is put into an ON state when the transistor M19 is in an OFF state. When the transistor M21 is put into an ON state, the power supply voltage VDDA is supplied to the node G via the transistor M21, so that a voltage of the node G becomes the voltage VDDA. Note that when the transistor M19 is in an ON state, the transistor M21 is in an OFF state, and thus, the voltage of the node G becomes the voltage V1 on the L level side.

Further, a drain of the PMOS transistor M22 which is a thin-film transistor is connected to the intermediate node (node H) which is a connection point between a drain of the transistor M20 and the drain of the transistor M10. The signal Oa is supplied to a gate of the transistor M22 from the node A, and the power supply voltage VDDA is supplied to a source of the transistor M22 from the power supply line. By this means, the transistor M22 is put into an OFF state when the transistor M20 is in an ON state and is put into an ON state when the transistor M20 is in an OFF state. When the transistor M22 is put into an ON state, the power supply voltage VDDA is supplied to the node H via the transistor M22, and a voltage of the node H becomes the voltage VDDA. Note that when the transistor M20 is in an ON state, the transistor M22 is in an OFF state, and thus, the voltage of the node H becomes the voltage V1 on the L level side.

In this manner, in the present embodiment, the intermediate node transitions between the fixed voltage VDDA and the voltage V1, and a delay period required for transitioning of the intermediate node is always constant regardless of change of the input signals Ia and Ib. Thus, at the nodes C and D, signals in synchronization with the input signals Ia and Ib can be obtained from the time of initial activation immediately after power-on. In a case where the duty ratio of the input signals Ia and Ib is 50%, the duty ratio of signals appearing at the node C and the node D also becomes 50%.

Note that while an example has been illustrated in FIG. 1 where the power supply voltage VDDA is applied to the gates of the transistors M21 and M22, an appropriate voltage equal to or lower than the withstand voltages of the transistors M19 and M20, for example, a voltage equal to or lower than VDDA may be applied.

The level shifter 30 is configured with a thick-film transistor. At the level shifter 30, the drain (node C) of the transistor M6 is also connected to gates of the PMOS transistor M11 and the NMOS transistor M12. The transistors M11 and M12 configure an inverter. In other words, the power supply voltage VDDB is applied to a source of the transistor M11 from the power supply line, and a drain of the transistor M11 is connected to a drain of the transistor M12. A source of the transistor M12 is connected to a reference voltage point. An inverted signal of the signal appearing at the node C appears at a connection point (hereinafter, referred to as a node E) between the drain of the transistor M11 and the drain of the transistor M12.

In the present embodiment, to reliably make the duty ratio 50% regardless of a difference between a period required for rising transition and a period required for falling transition, the signal appearing at the node E is synthesized with a signal appearing at the node D. The transistors M13 and M14 are employed to synthesize the signals. The power supply voltage VDDB is supplied to a source of the transistor M13 from the power supply line, the signal appearing at the node E is input to a gate of the transistor M13, and a drain of the transistor M13 is connected to a drain of the transistor M14. A source of the transistor M14 is connected to a reference voltage point, and the signal appearing at the node D is input to a gate of the transistor M14. A synthesis circuit is configured with the transistors M11 to M14. Note that while an example has been described where the signal appearing at the node C is inverted and synthesized with the signal appearing at the node D, the signal appearing at the node D may be inverted and synthesized with the signal appearing at the node C.

The transistor M13 causes a connection point (hereinafter, referred to as a node F) between the drain of the transistor M13 and the drain of the transistor M14 to transition to the H level by the signal appearing at the node E becoming the L level. On the other hand, the transistor M14 causes the node F to transition to the L level by the signal appearing at the node D becoming the H level. The signal appearing at the node E is an inverted signal of the signal appearing at the node C. Thus, a signal which transitions to the H level when the node C becomes the H level and which transitions to the L level when the node D becomes the H level appears at the node F.

It is considered that a delay period required for rising transition of the node C as a result of the transistor M19 being put into an OFF state is the same as a delay period required for rising transition of the node D as a result of the transistor M20 being put into an OFF state. Thus, a delay period required for a signal appearing at the node F to transition to the H level as a result of the transistor M19 being put into an OFF state is the same as a delay period required for the signal appearing at the node F to transition to the L level as a result of the transistor M20 being put into an OFF state. Thus, in a case where the transistors M19 and M20 are put into an ON state or OFF state on the basis of the input signals Ia and Ib having a duty ratio of 50%, the signal appearing at the node F has a period from rising to falling which is the same as a period from falling to rising and becomes a signal having a duty ratio of 50%.

Note that there are cases where a period exists during which the transistors M13 and M14 are put into an OFF state at the same time due to a temperature, process or voltage variation. Thus, if output of the node F is used as is as the output signal O, the node F becomes inconstant when the transistors M13 and M14 are put into an OFF state at the same time, which may invite a situation where a flow-through current flows. Thus, in the present embodiment, a latch circuit is connected to the node F.

In the example in FIG. 1, the inverter configured with the transistors M15 and M16 and the inverter configured with the transistors M17 and M18 configure the latch circuit. The power supply voltage VDDB is applied to a source of the PMOS transistor M15 from the power supply line, a signal of the node F is supplied to a gate of the PMOS transistor M15, and a drain of the PMOS transistor M15 is connected to a drain of the NMOS transistor M16. A source of the transistor M16 is connected to the reference voltage point, and the signal of the node F is supplied to a gate of the transistor M16. An inverted signal of the signal of the node F appears at a connection point (output terminal OUT) between the drain of the transistor M15 and the drain of the transistor M16. The signal becomes the output signal O. Note that a circuit which includes the latch circuit configured with the transistors M15 to M18 and which is configured with the transistors M11 to M18 may be referred to as a synthesis circuit.

The connection point between the drain of the transistor M15 and the drain of the transistor M16 is connected to the output terminal OUT and gates of the transistors M17 and M18, and the inverted signal of the signal of the node F is supplied to the gates of the transistors M17 and M18. The power supply voltage VDDB is applied to a source of the PMOS transistor M17 from the power supply line, and a drain of the PMOS transistor M17 is connected to a drain of the NMOS transistor M18. A source of the transistor M18 is connected to the reference voltage point. An inverted signal of the output signal O appears at a connection point between the drain of the transistor M17 and the drain of the transistor M18. The connection point between the drain of the transistor M17 and the drain of the transistor M18 is connected to the node F, and the inverted signal of the output signal O is provided to the node F. The signal of the node F is inverted and output from the output terminal OUT as the output signal O by the latch circuit configured with the transistors M15 to M18.

Note that in a case where a rising delay period $\Delta T2$ is too large, there is a case where a pulse width of the signal appearing at the node D becomes too narrow and disappears. Thus, in the present embodiment, the transistors M5 and M8 are provided to reduce a delay period of rising transition. The power supply voltage VDDB is supplied to a source of the PMOS transistor M5 from the power supply line, the signal Ob is applied to a gate of the PMOS transistor M5, and a drain of the PMOS transistor M5 is connected to a source of the transistor M6. The power supply voltage VDDB is supplied to a source of the PMOS transistor M8 from the power supply line, the signal Oa is applied to a gate of the PMOS transistor M8, and a drain of the PMOS transistor M8 is connected to a source of the transistor M9.

The transistor M5 is put into an ON state when the signal Ob becomes the L level, and the transistor M8 is put into an ON state when the signal Oa becomes the L level. By the transistor M5 being put into an ON state, it is possible to shorten a period required for the node C to transition from the L level to the H level. Further, by the transistor M8 being put into an ON state, it is possible to shorten a period required for the node D to transition from the L level to the H level. By this means, it is possible to prevent a width of the H level period from becoming too narrow at the nodes C and D.

(Operation)

Figure 7:
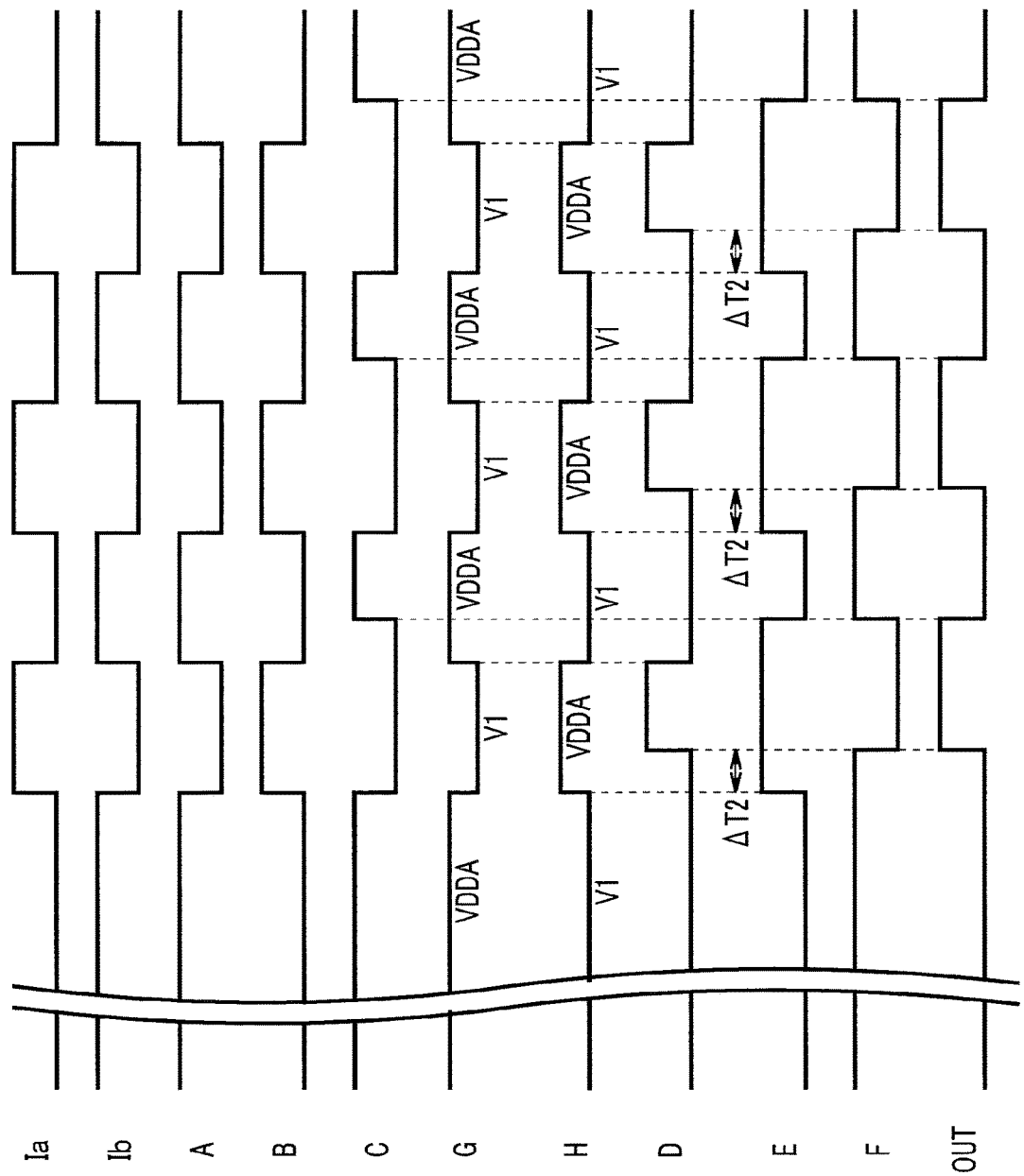
FIG. 7 is a timing chart for explaining operation of the embodiment.

Operation of the embodiment configured in this manner will be described next with reference to FIG. 7. FIG. 7 is a timing chart for explaining the operation of the embodiment. FIG. 7 illustrates the input signals Ia and Ib, and signals appearing at the nodes A, B, C, G, H and OUT. Note that while the input signals Ia and Ib are described as periodic signals as an example to simplify the explanation, various signals can be employed as the input signals Ia and Ib.

It is assumed that after the power supply voltages VDDA and VDDB are applied, the input signal 1a is the L level (the input signal Ib is the H level), the signal Oa is the H level, and the signal Ob is the L level. In this state, the transistor M20 is in an ON state, and the transistor M19 is in an OFF state. The transistor M20 is in an ON state, and thus, a voltage of the node H is the voltage V1 on the L level side.

In a case where the transistor M20 is in an ON state, a voltage of the H node is the voltage V1 on the L level side, and thus, the D node is the L level. Thus, the transistor M6 is in an ON state, and the transistor M5 is also in an ON state, and consequently, the node C is the H level. The transistor M9 is in an OFF state, and the node D remains to be the L level.

In the present embodiment, in a case where the transistor M19 is in an OFF state, the transistor M21 is in an ON state. Thus, in this case, a voltage of the node G becomes a fixed voltage VDDA.

Then, it is assumed that a state transitions from a state where the input signal Ia is the L level to a state where the input signal Ta is the H level (the input signal Ib is the L level). The input signals Ia and Ib are respectively inverted by the inverters INV1 and INV2. The signals Oa and Ob which are inverted signals of the input signals Ia and Ib respectively appear at the nodes A and B. In other words, the node A transitions from the level H to the level L, and the node B transitions from the level L to the level H. Consequently, a state of the transistor M19 is switched from an OFF state to an ON state, and a state of the transistor M20 is switched from an ON state to an OFF state.

Further, a state of the transistor M21 is switched from an ON state to an OFF state, and a state of the transistor M22 is switched from an OFF state to an ON state. Thus, a voltage of the node G changes from the fixed voltage VDDA to the fixed voltage V1. Further, a voltage of the node H changes from the fixed voltage V1 to the fixed voltage VDDA. Thereafter, the voltages of the nodes G and H change from the voltage V1 to the voltage VDDA or from the voltage VDDA to the voltage V1 every time the input signals Ia and Ib are inverted. Thus, a delay period from when the input signals Ia and Ib are inverted until when the nodes C and D are inverted is always constant. Thus, even in a case where the transistors M7 and M10 which configure the protection circuit are stacked on the transistors M19 and M20, the duty ratio of the output signal O does not fluctuate due to the influence of the transistors M7 and M10.

By this means, the level-shift circuit according to the present embodiment can achieve high-speed transmission. However, it can be considered that even at the level-shift circuit in FIG. 1, a delay period upon falling transition is different from a delay period upon rising transition, which exerts some influence on a duty ratio.

FIG. 7 illustrates a delay period by the influence. As illustrated in FIG. 7, delay periods of falling transition of the node C as a result of the transistor M19 being put into an ON state and falling transition of the node D as a result of the transistor M20 being put into an ON state are relatively short. In contrast, delay periods of rising transition of the node C as a result of the transistor M19 being put into an OFF state and rising transition of the node D as a result of the transistor M20 being put into an OFF state are relatively long. FIG. 7 indicates a difference in these delay periods as $\Delta T2$. As a result, as illustrated in FIG. 7, the L level period of the nodes C and D is longer than the H level period by a length corresponding to $2\Delta T2$.

In other words, rising of the node D is delayed by $\Delta T2$ from falling of the node C, and rising of the node C is delayed by $\Delta T2$ from falling of the node D. Thus, a period from rising of the node D to rising of the node C becomes the same as a period from rising of the node C to rising of the node D, which is a half of a cycle of the input signals Ia and Ib.

The inverter configured with the transistors M11 and M12 inverts a signal of the node C. By this means, the inverted signal of the signal of the node C appears at the node E. Thus, a period from rising of the node D to falling of the node E becomes the same as a period from falling of the node E to rising of the node D, which is a half of the cycle of the input signals Ia and Ib.

The transistor M13 is put into an ON state upon falling of the node E and makes the node F the H level. Further, the transistor M14 is put into an ON state upon rising of the node D and makes the node F the L level. As a result, as illustrated in FIG. 7, a signal having the duty ratio of 50% appears at the node F on the same cycle as the cycle of the input signals Ia and Ib.

The signal of the node F is inverted by the inverter configured with the transistors M15 and M16. The inverted signal of the signal of the node F is inverted by the inverter configured with the transistors M17 and M18 and provided to the node F. The signal of the node F is inverted by the latch circuit configured with the transistors M15 and M18 and, then, output from the output terminal OUT as the output signal O. Note that the output signal O is a signal which changes from 0 V to VDDB.

As illustrated in FIG. 7, the output signal O is a signal having the duty ratio of 50% and having the same cycle as the cycle of the input signals Ia and Ib.

In this manner, in the present embodiment, even in a case where the tolerant function is provided by the MOS transistors having a stack configuration, a level-shift circuit having an improved duty ratio is obtained by stabilizing a delay period of the output node by fixing the voltage of the intermediate node using the switch circuit. Further, in the present embodiment, a level-shift circuit having a further improved duty ratio is obtained by synthesizing differential output. Improvement of the duty ratio enables the semiconductor integrated circuit in the present embodiment to achieve high-speed signal transmission.

Second Embodiment

Figure 8:
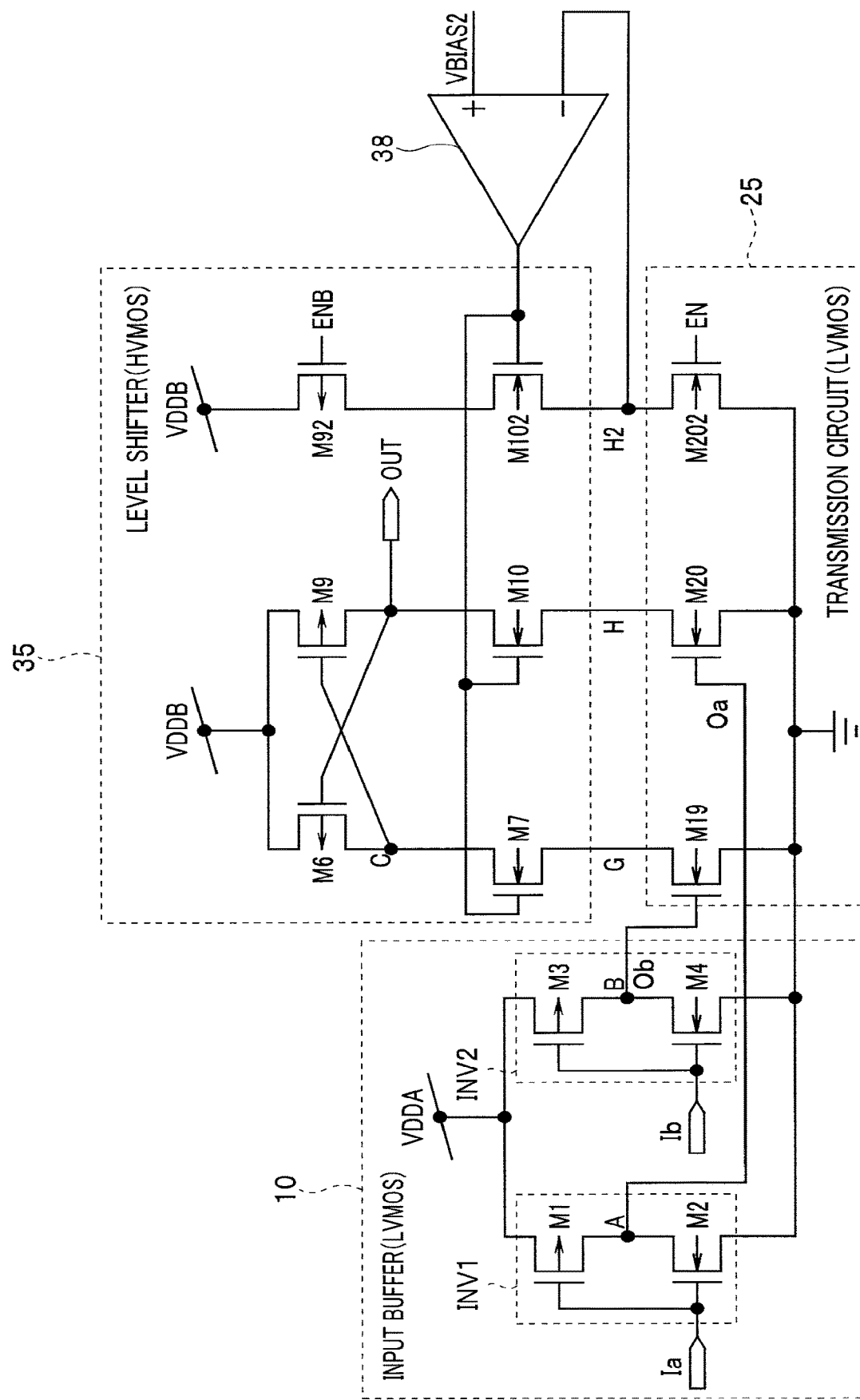
FIG. 8 is a circuit diagram illustrating a second embodiment of the present invention.

FIG. 8 is a circuit diagram illustrating a second embodiment of the present invention. In FIG. 8, the same reference numerals will be assigned to components which are the same as the components in FIG. 1, and description will be omitted.

In the comparative example in FIG. 4, the bias voltage VBIAS is set so as to prevent a voltage equal to or higher than the withstand voltages of the transistors M19 and M20 from being applied to the nodes G and H. The present embodiment enables the bias voltage VBIAS to be automatically set so that the voltages of the nodes G and H become desired voltages.

A level-shift circuit in FIG. 8 is different from the level-shift circuit in FIG. 4 in that transistors M92, M102 and M202 and a comparator 38 are added, and output of the comparator 38 is applied to the gates of the transistors M7 and M10.

The power supply voltage VDDB is supplied to a source of the PMOS transistor M92 from the power supply line, an enable signal ENB is applied to a gate of the PMOS transistor M92, and a drain of the PMOS transistor M92 is connected to a drain of the NMOS transistor M102. The output of the comparator 38 is provided to a gate of the transistor M102, and a source of the transistor M102 is connected to a drain of the NMOS transistor M202. An enable signal EN is applied to a gate of the transistor M202, and a source of the transistor M202 is connected to the reference voltage point.

The transistors M92, M102 and M202 respectively have configurations similar to the configurations of the transistors M6, M7 and M19 and also similar to the configurations of the transistors M9, M10 and M20. The enable signal ENB has reverse polarity with respect to the enable signal EN. Thus, the transistors M202 and M92 are put into an ON state at the same time and put into an OFF state at the same time.

A connection point (hereinafter, referred to as a node H2) between the source of the transistor M102 and the drain of the transistor M202 is connected to a negative input terminal of the comparator 38. A voltage VBIAS2 is provided to a positive input terminal of the comparator 38. The voltage VBIAS2 is set at a voltage which does not exceed withstand voltages of the transistors M19, M20 and M202, for example, a voltage equal to or lower than the voltage VDDA. The comparator 38 compares two input and provides output of a voltage level in accordance with a comparison result to the gates of the transistors M7, M10 and M102. The comparator 38 changes the output voltage so that a voltage of the node H2 becomes the same as the voltage VBIAS2.

In the embodiment configured in this manner, operation of setting the bias voltage to be provided to the gates of the transistors M7 and M10 is different from the operation in the comparative example in FIG. 4. After power-on, the transistors M202 and M92 are put into an ON state by the enable signals EN and ENB. The voltage of the node H2 is applied to the negative input terminal of the comparator 38. The comparator 38 compares the voltage of the node H2 and the voltage VBIAS2 supplied to the positive input terminal and applies a voltage in accordance with a difference to the gate of the transistor M102. As a result, the comparator 38 operates so that the voltage of the H2 node becomes the same as the voltage VBIAS2.

In other words, in a case where the voltage of the node H2 is lower than the voltage VBIAS2, an output level of the comparator 38 becomes higher, a drain-source voltage Vds of the transistor M102 becomes lower, and the voltage of the node H2 becomes higher. Inversely, if the voltage of the node H2 becomes higher than the voltage VBIAS2, the output level of the comparator 38 becomes lower, the drain-source voltage Vds of the transistor M102 becomes higher, and the voltage of the node H2 becomes lower. As a result, the voltage of the node H2 becomes the same as the voltage VBIAS2.

The transistors M92, M102 and M202 have configurations similar to the configurations of the transistors M6, M7 and M19 and also similar to the configurations of the transistors M9, M10 and M20. A voltage from the comparator 38 is applied to gates of the transistors M7 and M10. Thus, the voltages of the nodes G and H when the transistors M19 and M20 are in an ON state become the same as the voltage VBIAS2. By setting the voltage VBIAS2 at a voltage which does not exceed the withstand voltages of the transistors M19 and M20, it is possible to automatically determine an appropriate bias voltage of the transistors M7 and M10.

In this manner, in the present embodiment, it is possible to automatically determine an appropriate bias voltage of the MOS transistors which configure the protection circuit.

Note that in the present embodiment, a circuit has been described which does not address a problem that the intermediate node becomes Hi-Z and a problem that a duty ratio degrades due to a difference in delay periods between rising transition and falling transition. However, this point may be addressed in a similar manner to the first embodiment. For example, the bias voltage of the transistors M7 and M10 may be determined in a configuration where the transistors M92, M102 and M202 and the comparator 38 of the present embodiment are added to the circuit in FIG. 1.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor integrated circuit comprising:
   a first MOS transistor configured to receive an input signal of a first signal level corresponding to a voltage range of a first voltage at a gate, and control conduction and non-conduction between a reference voltage point and a first node;

a second MOS transistor connected to the first MOS transistor via the first node to configure a stack with the first MOS transistor, and configured to receive supply of a bias voltage at a gate and apply a voltage equal to or lower than a withstand voltage of the first MOS transistor to the first node;

a third MOS transistor configured to receive supply of a second voltage higher than the first voltage, receive a signal of a level in accordance with operation of the first MOS transistor at a gate, and output an output signal of a second signal level corresponding to a voltage range of the second voltage;

a fourth MOS transistor configured to receive a first control signal at a gate and control conduction and non-conduction between the reference voltage point and a second node;

a fifth MOS transistor connected to the fourth MOS transistor via the second node to configure a stack with the fourth MOS transistor, and configured to receive supply of the bias voltage at a gate and apply a voltage equal to or lower than a withstand voltage of the fourth MOS transistor to the second node;

a sixth MOS transistor configured to receive supply of the second voltage, receive a second control signal at a gate, and supply a voltage corresponding to the voltage range of the second voltage to the fifth MOS transistor;

a comparator configured to generate the bias voltage based on a difference between a reference voltage for setting the bias voltage and a voltage of the second node;

a seventh MOS transistor configuring a differential pair with the first MOS transistor, and configured to receive an inverted signal of the input signal at a gate and control conduction and non-conduction between the reference voltage point and a third node;

an eighth MOS transistor connected to the seventh MOS transistor via the third node to configure a stack with the seventh MOS transistor, and configured to receive supply of the bias voltage at a gate and apply a voltage equal to or lower than a withstand voltage of the seventh MOS transistor to the third node; and a ninth MOS transistor configured to receive supply of the second voltage to configure a cross couple circuit with the third MOS transistor, and to receive a signal of a level in accordance with operation of the seventh MOS transistor at a gate.

2. The semiconductor integrated circuit according to claim 1, wherein
the first MOS transistor, the second MOS transistor, the fourth MOS transistor, the fifth MOS transistor, the seventh MOS transistor, and the eighth MOS transistor are NMOS transistors, and
the third MOS transistor, the sixth MOS transistor, and the ninth MOS transistor are PMOS transistors.

3. The semiconductor integrated circuit according to claim 1, wherein
the reference voltage is a voltage equal to or lower than the withstand voltages of the first MOS transistor, the fourth MOS transistor, and the seventh MOS transistor.

4. The semiconductor integrated circuit according to claim 1, wherein
the second control signal is an inverted signal of the first control signal, and
the fourth MOS transistor and the sixth MOS transistor are simultaneously turned on or off.

* * * * *